(12) United States Patent
Hashimoto

(10) Patent No.: US 11,333,894 B2
(45) Date of Patent: May 17, 2022

(54) ANAMORPHIC ILLUMINATION OPTICS FOR A MEMS SPATIAL LIGHT MODULATOR

(71) Applicant: SILICON LIGHT MACHINES CORPORATION, Sunnyvale, CA (US)

(72) Inventor: Yoshimi Hashimoto, Kyoto (JP)

(73) Assignee: SILICON LIGHT MACHINES CORPORATION, San Jose, CA (US)

( * ) Notice: Subject to any disclaimer, the term of this patent is extended or adjusted under 35 U.S.C. 154(b) by 701 days.

(21) Appl. No.: 16/380,898

(22) Filed: Apr. 10, 2019

(65) Prior Publication Data

US 2019/0235256 A1    Aug. 1, 2019

Related U.S. Application Data

(60) Provisional application No. 62/817,297, filed on Mar. 12, 2019.

(51) Int. Cl.
*G02B 27/09* (2006.01)
*H01S 5/00* (2006.01)
(Continued)

(52) U.S. Cl.
CPC .......... *G02B 27/0911* (2013.01); *B33Y 30/00* (2014.12); *G02B 26/0808* (2013.01);
(Continued)

(58) Field of Classification Search
CPC ............ G02B 27/0911; G02B 26/0808; G02B 26/0841; G02B 27/4205; G02B 26/106;
(Continued)

(56) References Cited

U.S. PATENT DOCUMENTS

| 5,969,872 A * | 10/1999 | Ben Oren | G02B 3/0056 |
| | | | 348/E5.139 |
| 6,577,429 B1 * | 6/2003 | Kurtz | G02B 27/48 |
| | | | 348/E9.026 |

(Continued)

OTHER PUBLICATIONS

International Search Report for International Application PCT/US20/22162 dated Jun. 11, 2020.
(Continued)

*Primary Examiner* — Xinning(Tom) Niu
(74) *Attorney, Agent, or Firm* — William Nuttle

(57) ABSTRACT

A system including two dimensional, microelectromechanical system (MEMS) based spatial light modulators and anamorphic optics for improved contrast is provided. Generally, the system comprises an array of modulators having a plurality of pixels along a longitudinal axis, each pixel comprising a plurality of modulators along a transverse axis of the array. An illumination source including a laser and anamorphic optics for focuses light from the laser onto the array, and imaging optics focus modulated light from the array onto an image plane. The anamorphic optics are configured to provide a transverse numerical aperture (NA) along the transverse axis of the array that is smaller than a diffraction angle of the modulated light reflected from the array along a transverse axis of the image plane, and a longitudinal NA along the longitudinal axis of the array that is greater than the transverse NA. Other embodiments are also provided.

21 Claims, 9 Drawing Sheets

(51) Int. Cl.
*G02B 26/08* (2006.01)
*G02B 27/42* (2006.01)
*B33Y 30/00* (2015.01)
*G03F 7/00* (2006.01)

(52) U.S. Cl.
CPC ..... *G02B 26/0841* (2013.01); *G02B 27/4205* (2013.01); *G03F 7/0025* (2013.01); *H01S 5/005* (2013.01); *H01S 5/0071* (2013.01); *H01S 5/0085* (2013.01)

(58) Field of Classification Search
CPC ....... B33Y 30/00; G03F 7/0025; H01S 5/005; H01S 5/0071; H01S 5/0085
See application file for complete search history.

(56) References Cited

U.S. PATENT DOCUMENTS

| | | | |
|---|---|---|---|
| 2006/0258446 A1 | 10/2006 | Bloom et al. | |
| 2010/0208329 A1 | 8/2010 | Sandstrom et al. | |
| 2013/0050778 A1* | 2/2013 | Stowe | G02B 27/1046 358/475 |
| 2013/0050842 A1* | 2/2013 | Maeda | B41J 2/465 359/668 |
| 2013/0321786 A1 | 10/2013 | Tatsuta et al. | |
| 2015/0293497 A1* | 10/2015 | Song | G03H 1/2286 359/9 |

OTHER PUBLICATIONS

Written Opinion of International Searching Authority Application PCT/US20/22162 dated Jun. 11, 2020.

\* cited by examiner

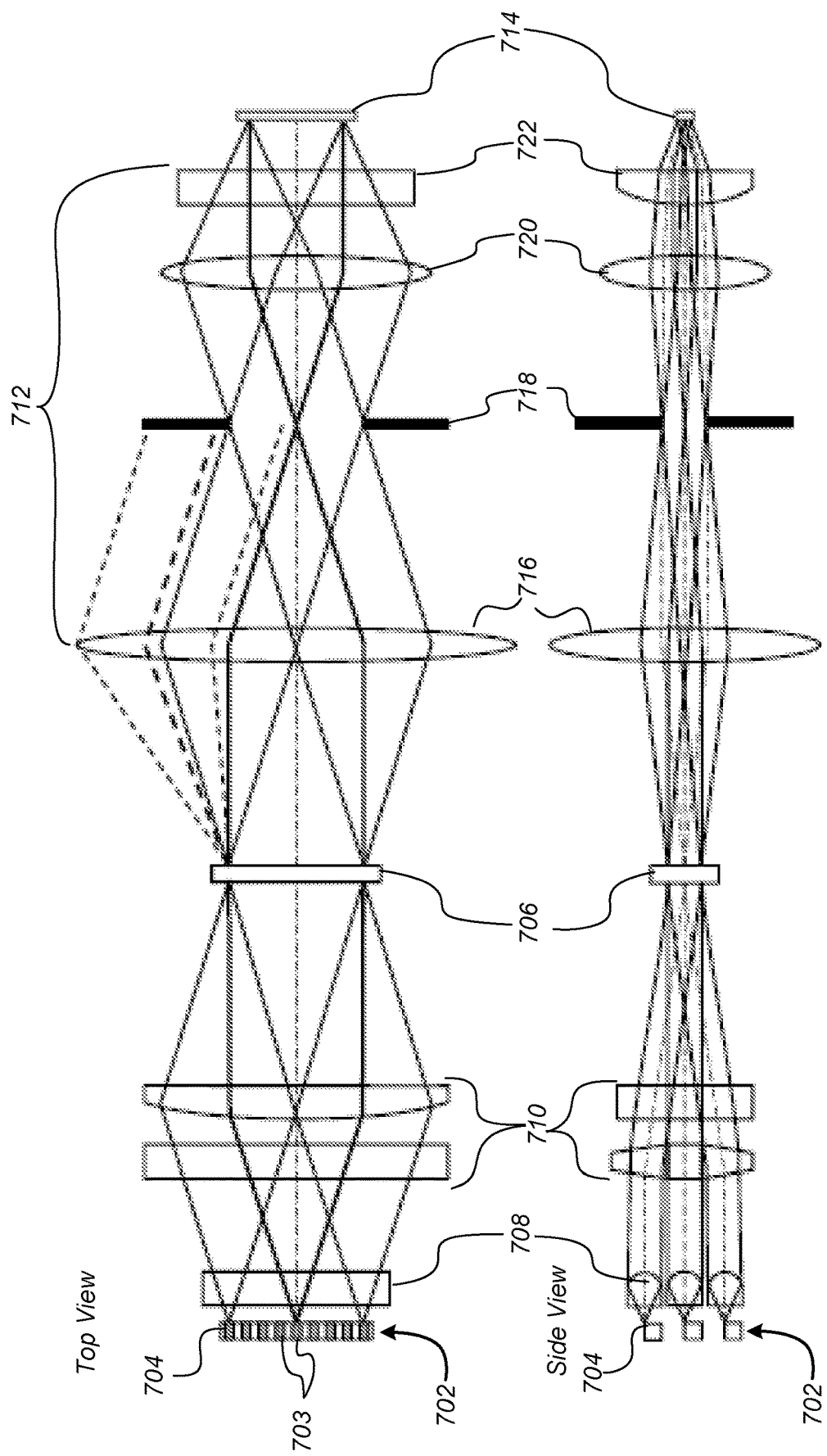

ANAMORPHIC ILLUMINATION OPTICS FOR A MEMS SPATIAL LIGHT MODULATOR

CROSS-REFERENCE TO RELATED APPLICATIONS

This application claims the benefit of priority under 35 U.S.C. 119(e) to U.S. Provisional Patent Application Ser. No. 62/817,297, filed Mar. 12, 2019, which is incorporated by reference herein in its entirety.

TECHNICAL FIELD

The present invention relates generally to spatial light modulators (SLMs), and more particularly to SLMs including two dimensional, microelectromechanical system (MEMS) based modulators and anamorphic illumination optics for improving contrast of the same.

BACKGROUND

Microelectromechanical system (MEMS) based spatial light modulators (SLMs) are increasingly being used for 3D printing applications, such as additive manufacturing (AM) systems, and selective laser sintering (SLS) and for providing images for printing, displays and computer-to-plate (CTP) applications including maskless lithography in semiconductor fabrication.

One type of SLM uses a diffraction grating in which light is reflected by a plurality of modulators into the $0^{TH}$ order non-diffraction mode or state, and plus and/or minus $1^{st}$ order diffraction modes. Generally, each modulator in the grating comprises a plurality of reflective surfaces such that in the diffractive mode light beams reflected by adjacent reflective surfaces undergo a relative phase shift of 180 degrees. In the non-diffractive mode, all light reflected by adjacent reflective surfaces are subject to substantially the same phase change. Light from a number of modulators is collected to form a pixel, which, for example, can appear dark when in the diffractive, $1^{st}$ order mode and light when in the diffractive state.

Generally, a sufficiently high contrast between pixels in the diffractive and non-diffractive state requires an illumination source with optics having a numerical aperture (NA) that is smaller than a half of the diffraction angle (θ) of the SLM, i.e., the angle between light reflected from a pixel in the $0^{TH}$ order mode or state, and that reflected in the plus and/or minus $1^{st}$ order mode.

Recently in an effort to increase productivity manufacturers of AM, SLS and CTP systems have sought to employ higher power illumination sources and SLMs having increased power handling capabilities. AM and SLS applications typically use near infrared (NIR) laser sources with a laser power of more than 1 kilowatt (kW). Other material processing applications, such as CTP, may also employ NIR laser sources, but as the power requirement for CTP is generally lower it is possible use lower power, less expensive semiconductor diode lasers. However, because each individual semiconductor diode laser or emitter generates much less laser power as compared to fiber lasers or solid state lasers a large number of emitters are required, resulting in illumination source for illuminating the SLM having a high number or large NA, reducing the amount of contrast that can be achieved. This is particularly problematic in CTP, which frequently use a one-dimensional (1D) SLM.

Accordingly, there is a need for an illumination source for a diffractive MEMS-based SLM capable of providing high power and improved contrast without the need for costly illumination sources having small NA optics.

SUMMARY

A spatial light modulator system including two dimensional, microelectromechanical system (MEMS) based spatial light modulators and an illumination source including anamorphic optics for improved contrast is provided.

The system comprises an array of modulators having a plurality of pixels along a horizontal or longitudinal axis, each pixel comprising a plurality of modulators along a vertical or transverse axis of the array, and a number of modulators along the horizontal or longitudinal axis. The illumination source includes a laser and anamorphic optics for focusing light from the laser onto the array, and imaging optics for focusing modulated light from the array onto an image plane. The anamorphic optics are configured to provide a vertical or transverse numerical aperture (NA) along the vertical or transverse axis of the array that is smaller than a diffraction angle of the modulated light reflected from the array along a vertical or transverse axis of the image plane, and a horizontal or longitudinal NA along the horizontal or longitudinal axis of the array that is greater than the vertical or transverse NA.

Generally, the number of 2D modulators along the vertical or transverse axis of the array is greater than the number of 2D modulators along the horizontal or longitudinal axis. In one embodiment, the number of 2D modulators along the horizontal or longitudinal axis in each pixel is two or fewer.

In other embodiments, the laser can include a plurality of high power diode lasers arranged as laser bar to illuminate a single pixel in the array.

BRIEF DESCRIPTION OF THE DRAWINGS

Embodiments of the present invention will be understood more fully from the detailed description that follows and from the accompanying drawings and the appended claims provided below, where:

FIG. 7 is an optics diagram illustrating illumination and imaging light paths along a single pixel along a horizontal or longitudinal axis of the array of an AM, SLS or CTP system according to another embodiment of the present disclosure.

DETAILED DESCRIPTION

Embodiments of systems including two dimensional, microelectromechanical system (MEMS) based spatial light modulators and an illumination source including anamorphic optics for improved contrast of the same are disclosed. In the following description, numerous specific details are set forth, such as specific materials, dimensions and processes parameters etc. to provide a thorough understanding of the present invention. However, particular embodiments may be practiced without one or more of these specific details, or in combination with other known methods, materials, and apparatuses. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1A:
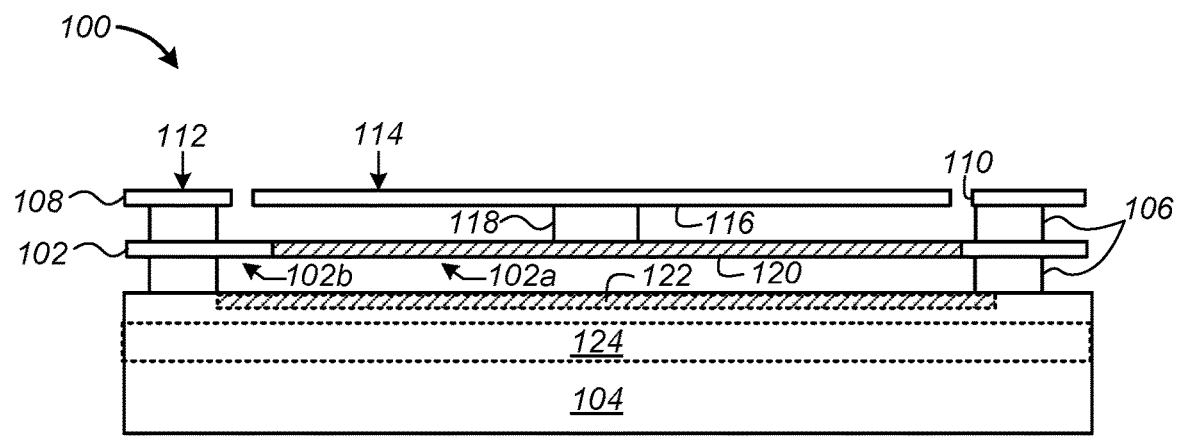
FIG. 1A is a schematic block diagram of a sectional side view of a two-dimensional (2D) Microelectromechanical System (MEMS) based modulator in a quiescent or undriven state.
Figure 1B:
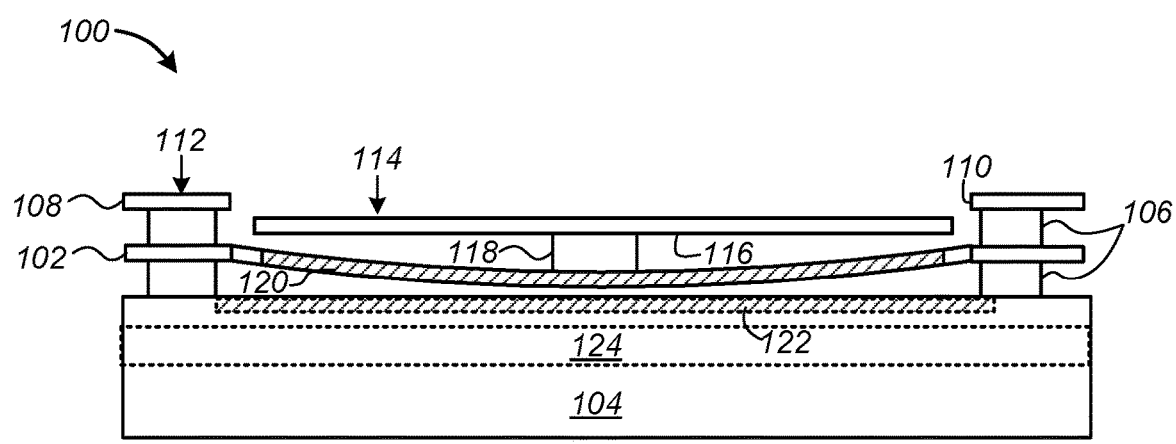
FIG. 1B is a schematic block diagram of a sectional side view of the portion of the modulator of FIG. 1A in an active or driven state.
Figure 1C:
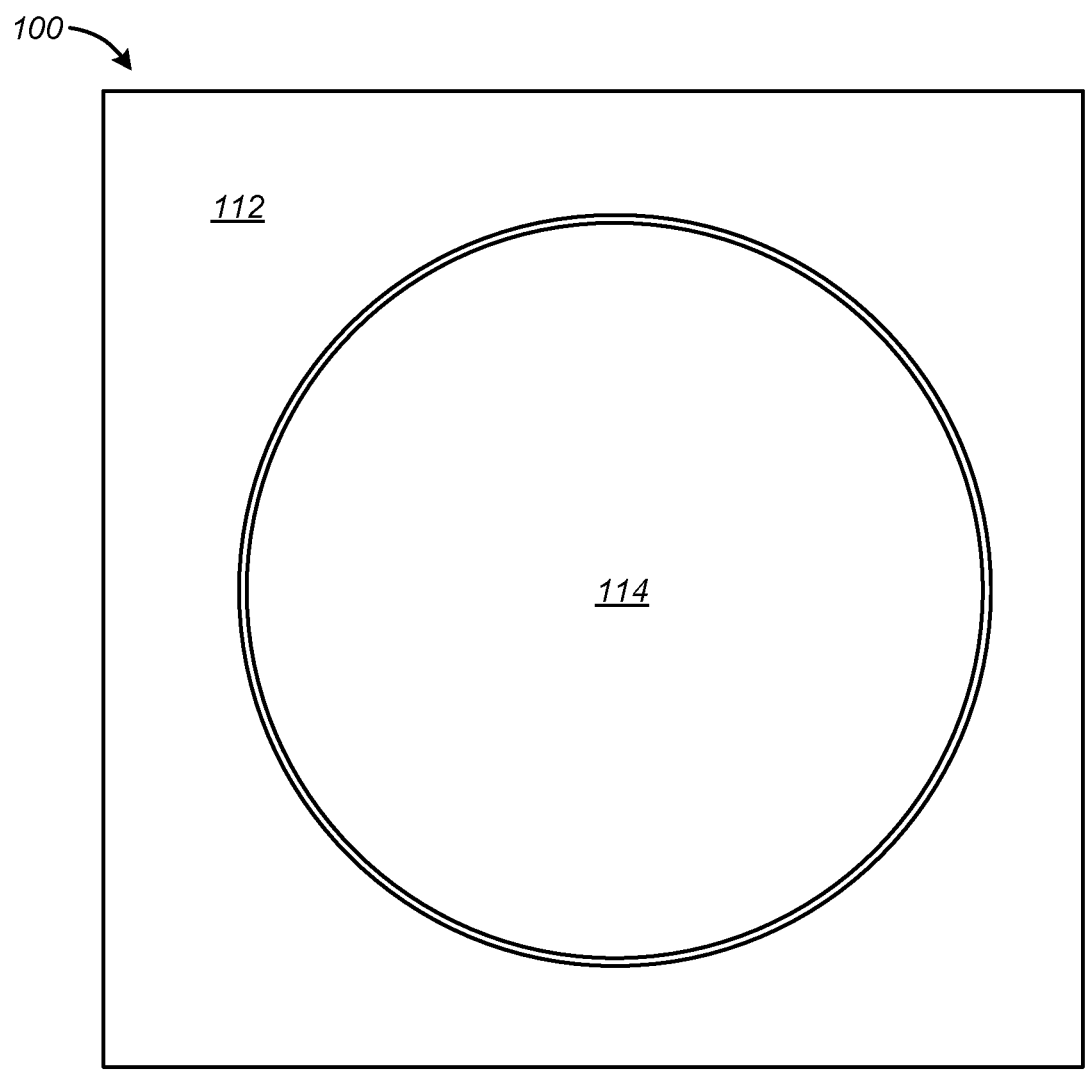
FIG. 1C is a top view of the modulator of FIG. 1A illustrating the static light reflective surface and the movable light reflective surface.

An embodiment of a two-dimensional (2D) Microelectromechanical System (MEMS) based, modulator, known as a Planar Light Valve (PLV™) commercially available from Silicon Light Machines, Inc., of Sunnyvale, Calif., for which the illumination source and anamorphic optics of the present disclosure is particularly advantageous is shown in FIGS. 1A through 1C.

For purposes of clarity, many of the details of fabricating and operating 2D MEMS-based, modulators, which are widely known and not relevant to the present invention, have been omitted from the following description. 2D MEMS-based, modulators are described, for example, in commonly assigned U.S. Pat. Ser. No. 7,064,883, entitled, "Two-Dimensional Spatial Light Modulator," by Alexander Payne et al., issued on Jun. 20, 2006, and incorporated herein by reference in its entirety.

FIG. 1A illustrates a schematic block diagram of a sectional side view of the 2D MEMS-based modulator in a quiescent or undriven state. Referring to FIG. 1A, the MEMS-based optical modulator 100 generally includes a piston layer 102 suspended over a surface of a substrate 104 by posts 106 at corners of the piston layer and/or modulator. The piston layer 102 includes an electrostatically deflectable piston 102a and a number of flexures 102b through which the piston is flexibly or movably coupled to the posts. A faceplate 108 including an aperture 110 through which the piston 102a is exposed is suspended over the piston layer 102. The modulator 100 further includes a first light reflective surface 112 on a top surface of the faceplate 108, and a second reflective surface 114 over the a top surface of the piston 102a. The second light reflective surface 114 can either be formed directly on the top surface of the piston 102a, or, as in the embodiment shown, on a mirror 116 supported above and separated from the piston 102a by a central post 118 extending from the piston to the mirror. The first and second light reflective surfaces 112, 114, have equal area and reflectivity so that in operation electrostatic deflection of the piston 102a caused by an electrode 120 in the piston and an electrode 122 in the substrate 104 brings light reflected from the first light reflective surface into constructive or destructive interference with light reflected from the second light reflective surface.

Generally, both the electrode 120 in the piston and the electrode 122 in the substrate 104 are coupled to one of a number drive channels (not shown in this figure) in a drive circuit or driver 124, which can be integrally formed in the substrate adjacent to or underlying the modulator 100, as in the embodiment shown. As explained in greater detail below, generally a number of individual modulators are grouped or ganged together under control of a single drive channel to function as a single pixel in an array of a SLM.

FIG. 1B is a schematic block diagram of the modulator 100 of FIG. 1A in an active or driven state, showing the piston 102a deflected towards the substrate 104, and FIG. 1C is a top view of the modulator of FIGS. 1A and 1B illustrating the static first light reflective surface 112 and the movable second light reflective surface 114.

Figure 2:
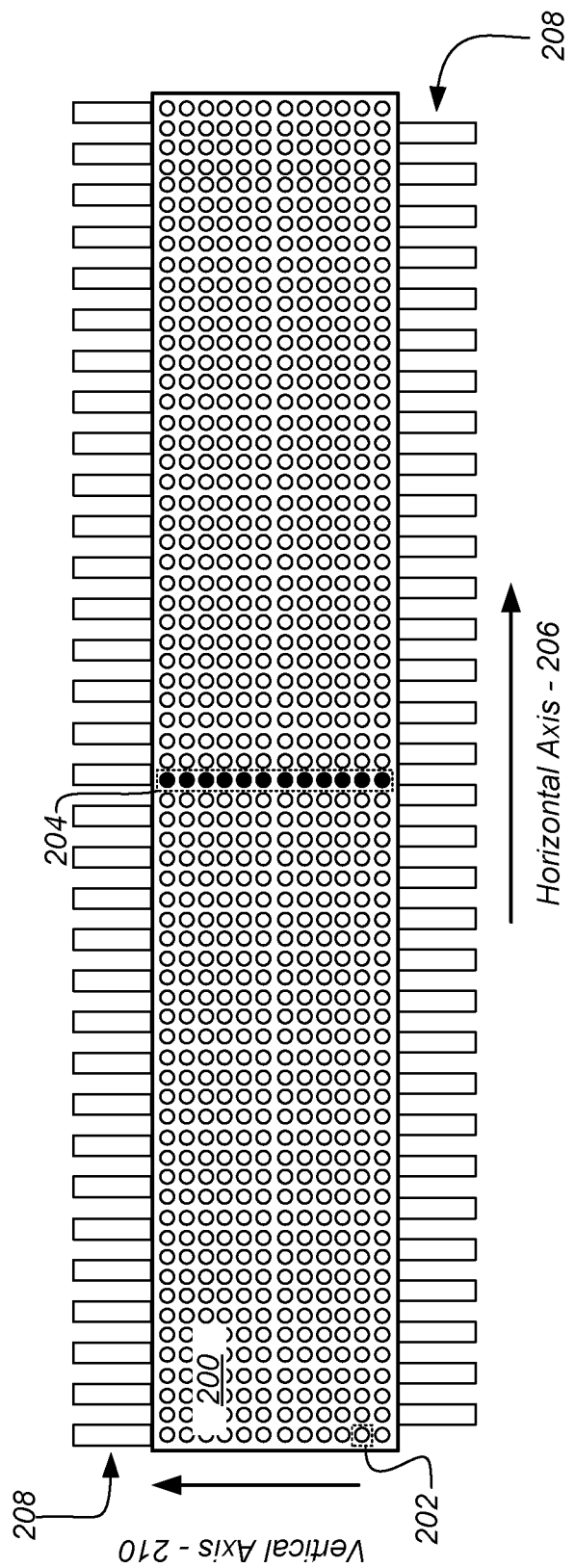
FIG. 2 is a block diagram of a top view of spatial light modulator (SLM) including an array of the modulators of FIGS. 1A-C, grouped or coupled together into a number of drive channels to form a number of pixels according to an embodiment of the present disclosure.

An exemplary linear array 200 of dense-packed, 2D modulators 202 will now be described with reference to the block diagram of FIG. 2. FIG. 2 is a planar top view of an array of the modulators of FIGS. 1A-C grouped or coupled together into a number of drive channels to form a number of pixels.

Referring to FIG. 2, in one embodiment the 2D modulators 202 are grouped into a linear array 200 of interleaved channels or pixels 204 along a first, horizontal or longitudinal axis 206. Each of the 2D modulators 202 in a single pixel 204 share a common drive channel or driver 208. Although in the embodiment shown each pixel 204 is depicted as having a single column of 12 modulators grouped along a transverse or vertical or transverse axis 210 perpendicular to the horizontal or longitudinal axis 206 of the array, it will be appreciated that each channel or pixel can include any number of 2D modulators arranged in one or two columns of any length across the width or vertical or transverse axis of the array without departing from the spirit and scope of the invention. Similarly, the linear array 200 can include a linear array of any number of pixels 204 or a number of linear arrays placed end to end.

This configuration can help to increase power handling of a linear array because the optical active area get wider by increasing the number of modulators per pixel. If the damage thresh hold per modulator is constant, power handling can be increased. Recently high power laser applications such as material processing or 3D printing require higher productivity and SLM which has high power handling are consequently required. Such kinds of applications are used high power NIR (near infrared) lasers of hundreds watts to several kilowatts. There are three types of lasers for high power NIR laser. One is semiconductor laser diodes. This laser is not expensive but beam quality is not good because a lot of emitters are combined to get higher power. Therefore coherence of the laser gets so low and it requires high NA optics. The others are solid state laser and fiber laser. These lasers have good coherence but these are expensive. These applications use thermal reaction and don't require high contrast ratio like photoresist. The CR would be at most 10 to 50.

In order to maximize or provide sufficient contrast for the linear array 200 it is desirable that light from an illumination source used illuminate the array, have a numerical aperture (NA) that is smaller than a half angle of sum of diffraction angles (θ) of the modulator and spreading angle (Θ) of size of modulators array, i.e., the angle between light reflected from a pixel 204 in the $0^{TH}$ order mode or state, and light reflected from the same pixel in the plus and/or minus $1^{st}$ order mode. However, according to Grating equation diffraction angles of a periodic surface, such as the array 200, are set by a ratio of wavelength of light incident on the array to a spatial period or pitch of features of the periodic surface, i.e., the pixels 204. Grating equation states:

$$\sin \theta = m\lambda/\Lambda$$

where θ is a diffraction angle of light reflected from the surface, m is order of diffracted ray (integer), λ is the wavelength of the incident light, and Λ is a spatial or pitch of modulators 202. When we focus on a single pixel which has multiple modulators 202 and the incident light is ideal plane wave or NA=0, the light spreads due to Huygen-Fresnel principle. The spreading angle Θ is defined:

$$\Theta = \lambda/D$$

Where D is a pixel size.

Thus, achieving adequate contrast with grating based SLMs requires either expensive illumination optics having a very small NA, or providing large diffraction angle by reducing the size and spatial period or pitch of the modulators. However, this approach is problematic for a number of reasons including the need for larger, higher voltage drive circuits and a reduction of an optical power handling capability of the SLM.

However, because the linear array 200 is configured to have pixels 204 including multiple modulators 202 arranged along the vertical or transverse or transverse axis 210 but with a much smaller number, generally only one or two modulators, arranged along the horizontal or longitudinal axis 206, the spreading angle $\Theta_H$ of diffracted light from the pixel 204 along the longitudinal axis, where the pixel size is much smaller than along the vertical or transverse or transverse axis, is much larger than the spreading angle $\Theta_V$ of the pixel along the transverse axis. Consequently if the incident light has an ideal beam quality, the NA along the vertical or transverse or transverse axis 210 to provide the desired contrast is smaller than the NA along the horizontal or longitudinal axis 206.

Figure 3:
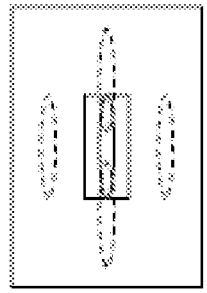
FIG. 3 is a block diagram of portion of the array of FIG. 2 illustrating an angular spectrum for a single pixel in the array of FIG. 2, and showing differences between a vertical or transverse numerical aperture (NA) and horizontal or longitudinal NA of the pixel.
Figure 3:
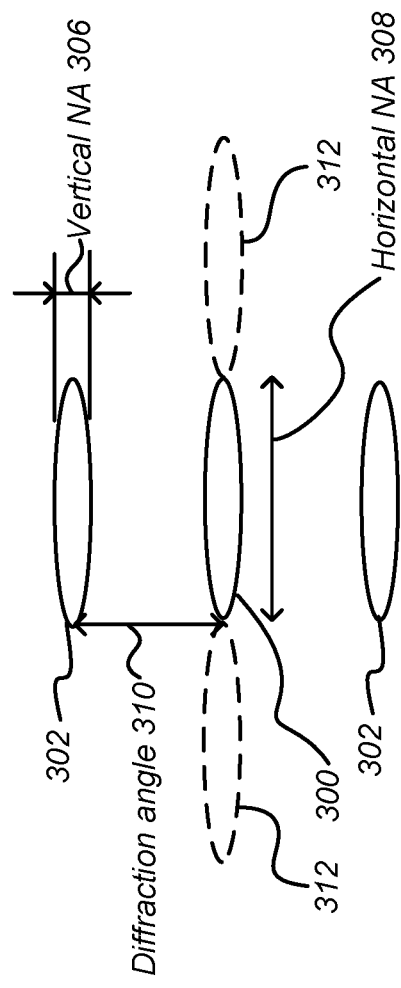

FIG. 3 is a block diagram of portion of the array of FIG. 2 illustrating an angular spectrum for a single pixel of a linear array having a grating pitch of 25 μm when illuminated with or by an ideal plane light having a wavelength of 1064 nm and a diffraction angle of 2.3 degrees. Referring to FIG. 3, ellipse 300 represents the $0^{th}$ order beam, while ellipse 302 represent $1^{st}$ order beams along the vertical direction, and ellipse 312 represent $1^{st}$ order beams along the horizontal direction. FIG. 3 also shows the differences between a transverse or vertical numerical aperture (NA) 306 and longitudinal or horizontal NA 308 relative to the diffraction angle 310. The diffraction angle in the horizontal direction is same as vertical diffraction angle because modulators are arranged with the same pitch both along the vertical and horizontal directions. To provide an adequate contrast ratio, only the $0^{th}$ order beam should be passed by the illumination optics without interference from other higher order beams. In the embodiment shown, the vertical NA 306 provides a large separation between the $0^{th}$ order beam (represented by ellipse 300) and 1st order beams (represented by ellipse 302). This means that vertical NA 306 can be increased until these beams are touching. The horizontal NA 308 on the other hand does not provide enough separation between $0^{th}$ order beam (represented by ellipse 300) and the $1^{st}$ order beams (represented by ellipse 312). However, even though the horizontal NA is increased and the 0th order beam 300 is interfered with by the horizontal $1^{st}$ order beam (represented by ellipse 312), most optical energy is distributed to vertically diffracted beams when the pixel is driven. This enables an adequate contrast ratio to be provided when the vertical NA 306 is set so that the $0^{th}$ order beam (represented by ellipse 300) and 1st order beams (represented by ellipse 302) do not interfere.

Thus, in a system according to the present disclosure including a SLM with a linear array of 2D grating-based modulators it is possible to achieve the desired degree of contrast by using inexpensive anamorphic illumination optics and high powered diode lasers. By anamorphic illumination optics it is meant a number of optical elements including lenses, prisms and mirrors having different magnification along at least two non-parallel axes. In the present disclosure the anamorphic illumination optics provide a smaller NA along the transverse or vertical axis 210 than the NA provided along the horizontal or longitudinal axis 206.

Preferably, the illumination is shaped or focused into a line of illumination using, for example, a cylindrical aspheric lens having a hyperbolic profile, sometimes called a Powell Lens, to extend substantially uniformly across the length of a single pixel 204 and is scanned along the length of the horizontal or longitudinal axis 206 of the linear array 200 using moving mirrors in the illumination and/or imaging optics (not shown in this figure). But these optics can work when a single mode laser such as a solid state laser is employed. Semiconductor laser is required to have other types of homogenizing optical device.

An embodiment of a direct imaging system 400, such as a computer to plate (CTP) system for commercial printing or a maskless lithography system, including the SLM 402 of FIG. 2 and anamorphic optics for improved contrast and power according to the present disclosure will now be described with reference to FIG. 4. More particularly, in the embodiment shown in FIG. 4 the direct imaging system 400 is a CTP system having a SLM 402 including a linear array 402a of 2D MEMS-based modulators and plurality of integrated drive channels or drivers 402b as described above. An advantage of using an SLM 402 including a linear array 402a in this application is that it helps to increase productivity. CTP application needs to write images on the photosensitive plates which have large area such as 1 m×1 m and high resolution ≥2400 dpi. It is difficult for scanning optics with fθ lens to meet both requirements. Generally CTP system uses mechanical scanning such as rotation drum. Optics for CTP system is just projecting laser beam on the material. To use multiple laser light sources is another solution to increase the productivity. But there is a limitation in numbers of laser sources to build up. SLM including a linear array is the most useful solution.

Figure 4:
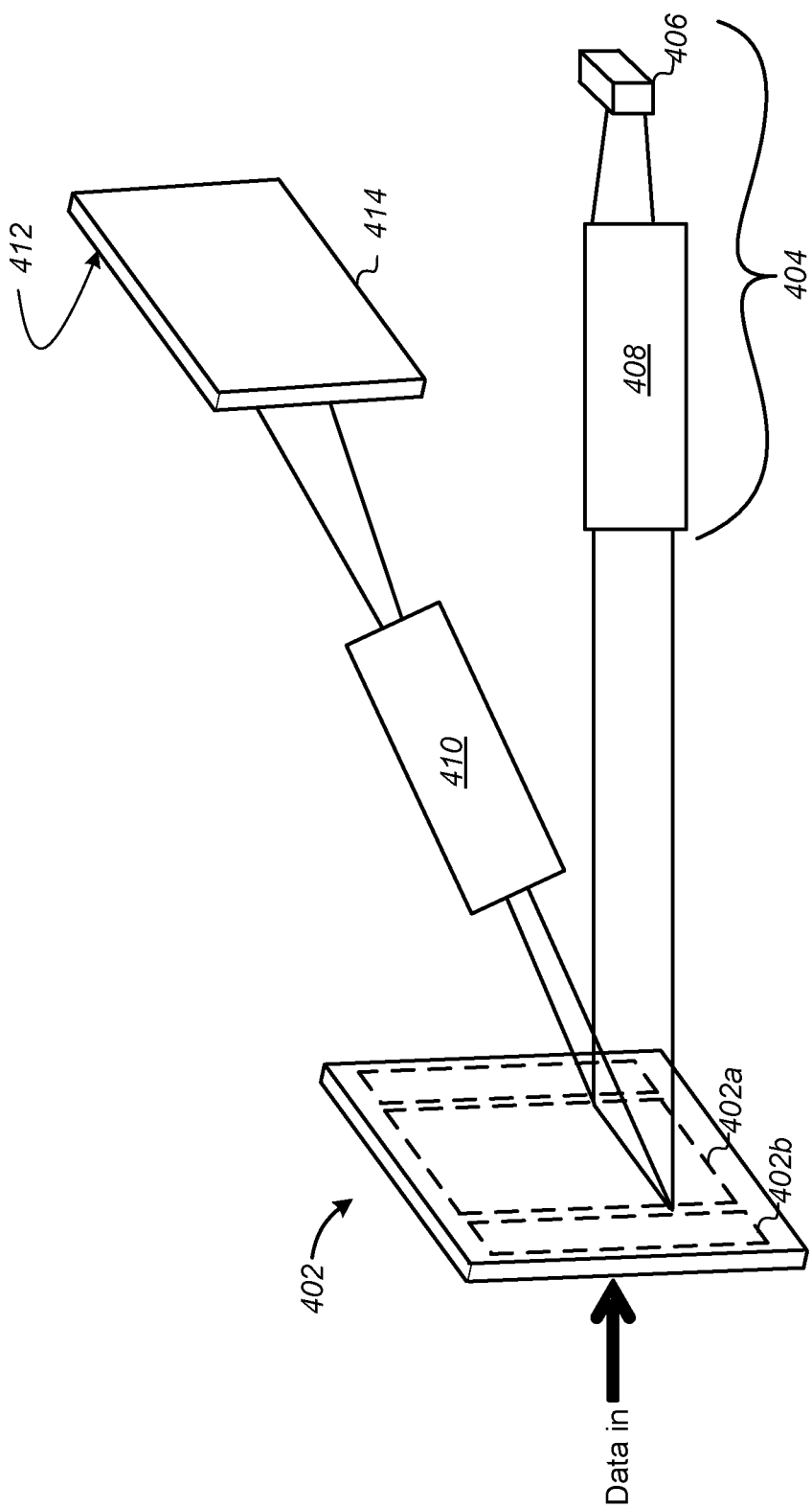
FIG. 4 is a schematic block diagram of an embodiment of an optical head for computer-to-plate (CTP) system including the SLM of FIG. 2, and an illumination source for improving contrast according to the present disclosure.

Referring to FIG. 4, the direct imaging system 400 further comprises an illumination source or illuminator 404 including a light source 406, and illumination optics 408 to direct coherent light from the light source onto the linear array 402a. The system 400 further includes imaging optics 410 to direct an image (modulated light) from the linear array 402a onto a photosensitive or photoconductive surface of an imaging plane 412, shown here as a substrate 414, such as an aluminum plate for commercial printing, a wafer on which micro-electronic devices are to be formed, or a mask for making such devices. By micro-electronic devices it is meant both integrated circuits (ICs) and Micro-Electromechanical System or MEMs devices.

The light source 406 can include any light emitting device capable of continuously emitting light at a sufficient power level or power density, and at a single or narrow range of wavelengths to enable light reflected from modulators of the linear array 402a to be modulated in phase and/or amplitude by diffraction. In certain applications the light source 406 can include a number of emitters, such as light emitting diodes (LEDs) or diode lasers, each powered from a common power supply (not shown) in a CW (Continuous Wave) operation. Preferably, the light source 406 includes a plurality of diode lasers arranged as a laser bar parallel to the transverse or vertical or transverse axis of the linear array 402a. More preferably, a bar laser generally has 1 cm length and produce from about 40 to about 1 kilowatt (kW) of power at a wavelength ($\lambda$) in the near infrared (NIR) of from about 750 to about 1000 nm. To achieve powers higher than 1 kilowatt (kW) a number of bars can be stacked vertically and horizontally.

The illumination optics 408 generally includes a number of elements including one or more prisms, lenses, mirrors and integrators designed to transfer light from the light source 406 to the linear array 402a such that a line of a specified length and width is illuminated on the array. Preferably, in accordance with the present disclosure the illumination optics 408 are anamorphic illumination optics including one or more prisms, lenses, mirrors and integrators designed to transfer light from the light source 406 to the linear array 402a such that a line of a specified length and width is illuminated on the array. Anamorphic optics is described in greater detail below with reference to FIGS. 6A and 6B. The NA of the anamorphic illumination optics 408 along the vertical axis of linear array 402a should be lower than half of diffraction angle of $+/-1^{st}$ order beam of the modulator to separate $0^{th}$ order beam from the $+/-1^{st}$ order beams. But the NA along the transverse axis of linear array is allowed to get larger angle of the half of diffraction angle of $+/-1^{st}$ order beams in case of the application that high contrast ratio is not required.

Generally, the imaging optics 410 include magnification and filtering elements to direct modulated light from the linear array 402a to the photoconductive layer located on the imaging plane 412. Preferably, because the pixel size and shape of the linear array 402a is not necessarily square, the imaging optics 410 are also anamorphic imaging optics and can include magnification and filtering elements, such as one or more Fourier transform (FT), cylindrical and/or anamorphic lenses and apertures. Anamorphic imaging optics is described in greater detail below with reference to FIGS. 6A and 6B.

As described above with reference to FIG. 2, the linear array 402a generally includes a large number of individual diffractive 2D densely packed spatial light modulators (not shown in this figure), grouped or functionally linked to provide a number of pixels in the linear array that can be controlled by drive signals from a single, common drive channel. The pixel size along the vertical axis is longer than the one along horizontal axis because modulators are arranged along the vertical direction. Preferably, the linear array 402a has a pixel count of at least about 500 pixels, and most preferably of at least about 1000 pixels to provide the desired resolution. More preferably, the imaging optics 410 are designed to transfer light from the linear array 402a to the substrate 414 such that a photoconductive layer located on the imaging plane is illuminated across a swath in which each pixel projected onto the imaging plane has a substantially square size and shape.

An embodiment of a three-dimensional (3D) printing system, such as an additive manufacturing (AM) or selective laser sinter (SLS) system, including the SLM of FIG. 2 and anamorphic optics for improved contrast and power according to the present disclosure will now be described with reference to FIG. 5. More particularly, in the embodiment shown in FIG. 5 the 3D printing system is a polymerization AM system including both anamorphic illumination and imaging optics.

Figure 5:
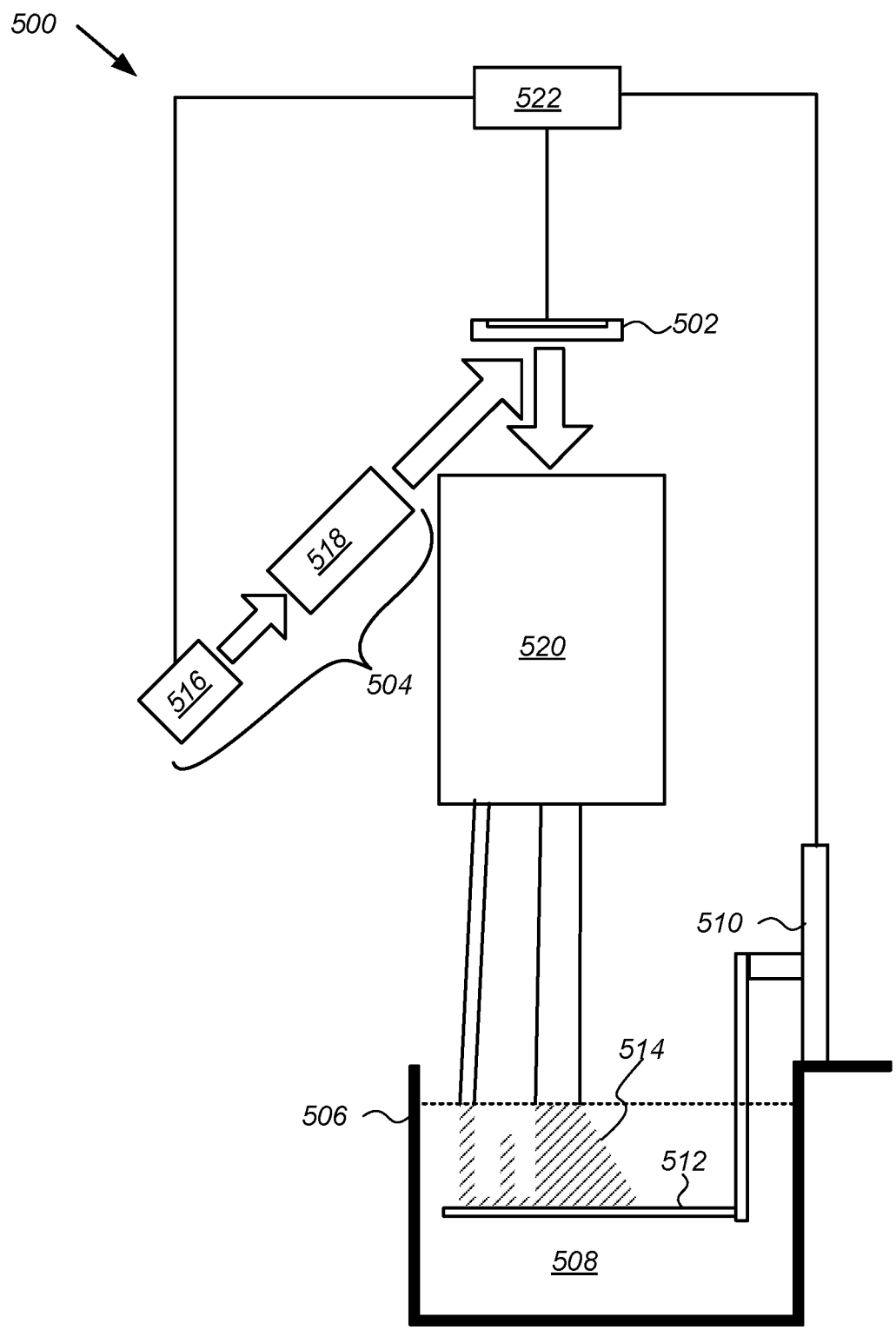
FIG. 5 is a schematic block diagram of an embodiment of a 3D printing system, such as an additive manufacturing (AM) or selective laser sinter (SLS) system, including the SLM of FIG. 2, and an illumination source for improved contrast and power according to the present disclosure.

Referring to FIG. 5, the AM system 500 includes a two-dimensional (2D) MEMS-based diffractive SLM 502 with a number of pixels, each with multiple diffractors to modulate a beam of light generated by an illumination source 504, a vat 506 containing the material 508 such as photopolymer powder or metal powder or resin, and a transport mechanism 510 to raise and lower a work surface 512 on which an object 514 is printed into the vat.

In accordance with the present disclosure the illumination source 504 includes a light source 516, and illumination optics 518 to direct laser light from the light source onto SLM 502. Preferably, the illumination optics 518 are anamorphic illumination optics and can include one or more prisms, lenses, mirrors and integrators designed to transfer light from the light source 516 to the SLM 502 such that a specified length and width is illuminated on SLM. Anamorphic optics is described in greater detail below with reference to FIGS. 6A and 6B. The NA of illumination optics 518 along a fast or vertical axis of the SLM 502 should be lower than half of diffraction angle of $+/-1^{st}$ order beam of the modulator to separate $0^{th}$ order beam from the $+/-1^{st}$ order beams. However, it is noted that in certain embodiments the NA along a transverse axis of the SLM 502 is allowed to be larger than half of a diffraction angle of the $+/-1^{st}$ order beams in case of applications where a high contrast ratio is not required.

Generally, the AM system 500 further includes imaging optics 520 to transfer modulated light from the SLM 502 toward the work surface 512, and a controller 522 to control operation of the light source 516, the SLM and the transport mechanism 510. Preferably, in accordance with the present disclosure the imaging optics 520 are also anamorphic imaging optics and can include magnification and filtering elements, such as one or more FT, cylindrical and anamorphic lenses and/or apertures. Anamorphic imaging optics is described in greater detail below with reference to FIGS. 6A and 6B.

The transport mechanism 510 is adapted and controlled by the controller 522 to lower the work surface 512 into the vat 506 as the modulated light converts the material 508 into a solid, building successive layers or cross-sections of the object 514 to be printed. Generally, the layers can be from about 100 μm to 1 mm thick.

Figure 6A:
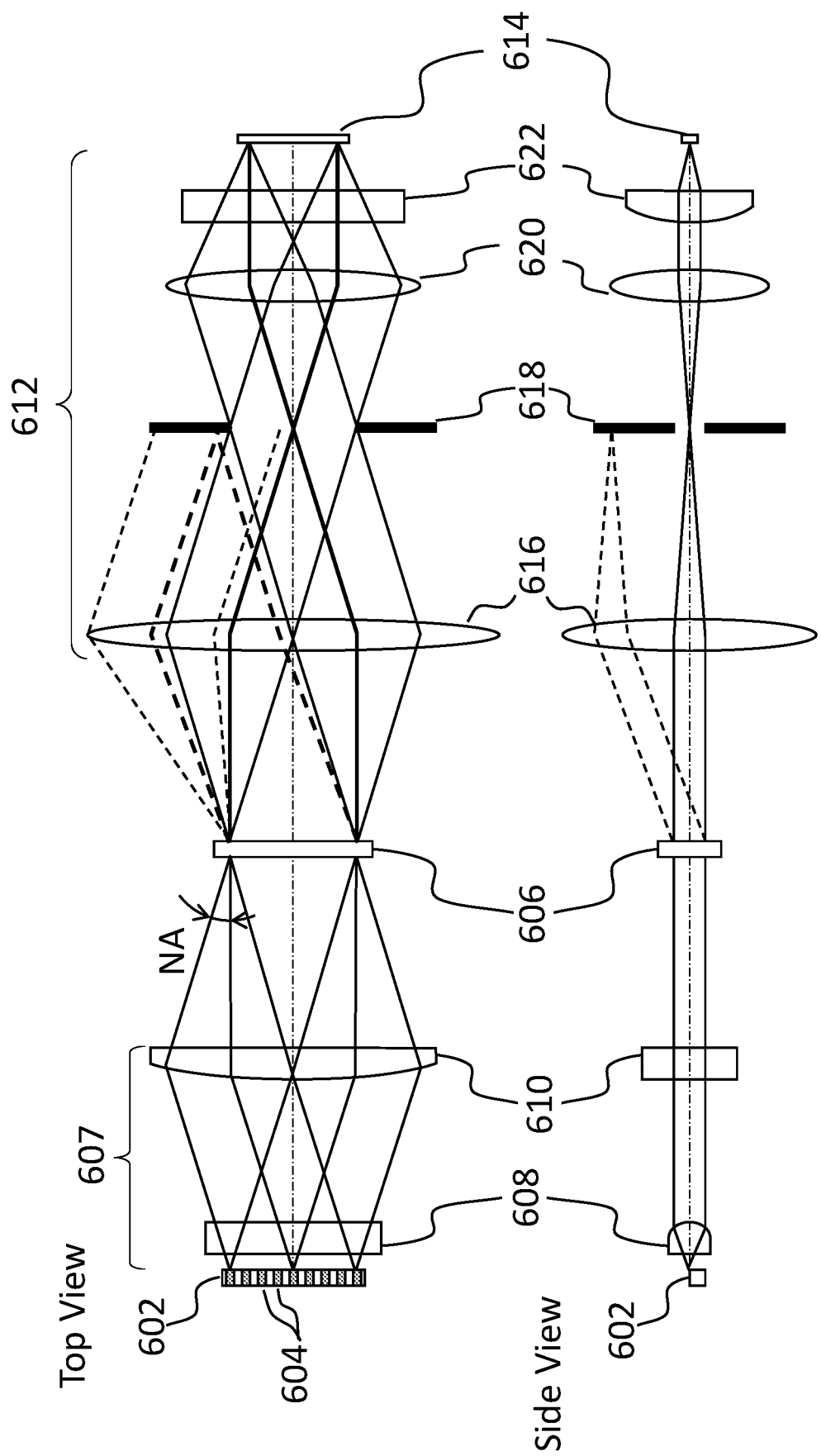
FIG. 6A is an optics diagram illustrating illumination and imaging light paths along a single pixel along a horizontal or longitudinal axis of the array of an AM, SLS or CTP system according to an embodiment of the present disclosure.

FIG. 6A is an optics diagram illustrating both top and side views of light paths for anamorphic illumination and imaging optics according to an embodiment of the present disclosure. The top view shows an optical paths along a pixel arranged direction. Referring to FIG. 6A, the light path begins at a light source, such as a laser 602 shown, in this embodiment, as including a plurality of light emitting or laser diodes 604 arranged as a bar laser to illuminate a substantially linear portion of a 1D or 2D array 606 of an SLM through anamorphic illumination optics 607, including a first optical element or lens 608 and second optical element or lens 610. Although in the embodiment shown the anamorphic illumination optics 607 are depicted or represented by two single lenses 608 and 610, it will be appreciated that the anamorphic illumination optics can include any number of prisms, lenses and to refract and transmit light from the laser 602 to the linear array 606 to fully illuminate the linear array. The optics 608 is usually called FAC lens (Fast Axis Collimator) to collimate laser from the emitters along the vertical axis or fast axis of emitters. In the embodiment shown, the laser 602 is a bar laser including multiple semiconductor diode lasers or emitter arranged along common long axis. Each emitter of the bar laser 602 works as spatially single mode laser and it has Gaussian beam profile along the vertical axis. As shown in side view in FIG. 6A, we can get almost ideal collimated beam. As the size of modulator along the vertical axis is one or several millimeter, focusing optics or reduction optics is not required. It means the beam of illumination NA along the vertical direction is almost zero. If an optical device like Powell lens is inserted to convert the Gaussian to Top-hat profile, we can illuminate modulators evenly which are arranged vertically in a single pixel. In the top view in FIG. 6A the optical element or lens 610 works for illumination of whole a spatial right modulators array along the horizontal axis. A light pipe or a fly eye lens array can be included in the optical element or lens 610 to homogenize the light from the bar laser 602 emitters 604. As a bar laser has multiple emitters and generally has 10 mm width along the horizontal axis, it functions to some degree as a NA. In the instance in which the optical element or lens 610 is a single cylindrical lens, the NA would be D/2f, where D is size of the bar laser and f is the focal length of the cylindrical lens in the optical element or lens 610. When an optical device to homogenize illumination is inserted in the optical element or lens 610, the NA number would be extended. Thus, while NA along the fast axis or vertical axis is low, NA along the slow axis or horizontal axis could be much bigger than fast axis.

As disclosed in the FIG. 6A, pixel arranged direction of the linear array 606 is set parallel to emitter arranged direction of the bar laser 602. Such the configuration enables to use diffraction beams effectively. When we focus on the horizontal axis, NA of illumination optics has some number because of the size of emitter array, while the condition to separate diffraction beams by the linear array 606 is limited. The imaging optics 612 can include magnification elements, such as a Fourier Transform (FT) lens 616, and Fourier aperture 618. As described above, the array includes just one or a few pixels along the horizontal direction and $1^{st}$ order beams can be separated from $0^{th}$ order beam only when the illumination NA is almost zero. Therefore a part of $1^{st}$ order beam interfere the $0^{th}$ order beam. In FIG. 6A the dashed lines illustrate $1^{st}$ order beams while the solid, bold line show the main, $0^{th}$ order beams. Since the NA of illumination beam is kept after it is diffracted to $1^{st}$ order beam by the linear array 606, some of the $1^{st}$ order beams pass through the Fourier aperture 618. On the other hand, NA of illumination optics along the vertical axis is small and the number of modulators in a single pixel is so large that diffraction, main beams are separated.

Modulated light from the linear array 606 is then transmitted through imaging optics 612 to the imaging plane 614. In some embodiments, such as that shown in FIG. 6A, the imaging optics 612 can also include anamorphic optics, represented here by anamorphic lens 620 and cylindrical lens 622. This embodiment is particularly advantageous where the pixel size of array 606 is not square. By using or adding anamorphic imaging optics to the imaging optics 612 a reduced image of the linear array is projected on the imaging plane along the vertical direction, thereby correcting or compensating for any distortion or non-square pixels in the of linear array 606.

Figure 6B:
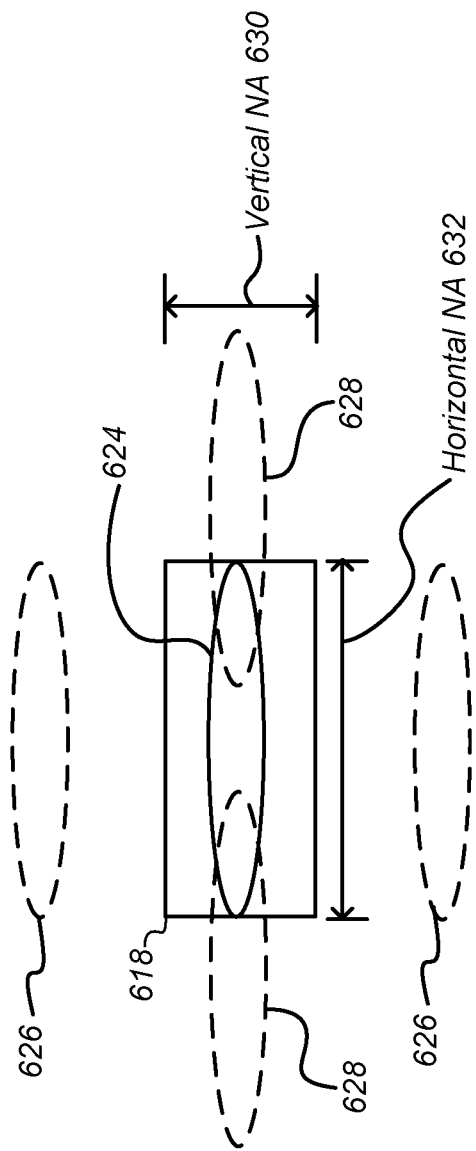
FIG. 6B shows that $0^{th}$ order beam and diffracted $+/-1^{st}$ order beams on the Fourier aperture of the optics diagram illustrated in FIG. 6A.

FIG. 6B shows that $0^{th}$ order beam and diffracted $+/-1^{st}$ order beams on the Fourier aperture 618. Referring to FIG. 6B, ellipse 624 represents the $0^{th}$ order beam, while ellipse 626 represent $1^{st}$ order beams along the vertical direction, and ellipse 628 represent $1^{st}$ order beams along the horizontal direction. As in FIG. 3 above, the aperture size along the vertical axis (vertical NA 630) is equivalent to the diffraction angle of $1^{st}$ order beam and a size of the $0^{th}$ order beam 624 along the horizontal axis is the same as the horizontal NA 632 of illumination optics (608 and 610 in FIG. 6A). Referring again to FIG. 6B, it is seen that the $0^{th}$ order beam 624 can pass through the Fourier aperture 618 while the $+/-1^{st}$ order beams along the vertical axis (represented by ellipse 626) are completely blocked, and the $+/-1^{st}$ order beams along the horizontal axis (represented by ellipse 628) are substantially blocked or significantly reduced in power. This results in a slightly degraded contrast ratio (CR). However, thermally sensitive material generally does not require a high CR because thermal energy provided by laser illumination cannot be sustained for a long time and it does not contribute to chemical or physical reactions. Thus, the illumination and imaging optics of the embodiment of FIG. 6A is suitable for use in a CTP system and a thermal SLS system, such as that shown in FIG. 4.

The power of bar lasers including a plurality of laser diodes is not as high as in the examples given above, and is generally equal to or less than 100 watts (W). In order to increase a total illumination power multiple bar lasers should be used. Thus, in some embodiments a vertical stack of bar lasers can be used to achieve higher powers. FIG. 7 is an example of one such stacked configuration. Referring to FIG. 7, a light source 702 includes a plurality of laser diodes 703 arranged in laser bars 704 to illuminate a single pixel in a linear array 706 of an SLM through anamorphic illumination optics including a number of second prisms and lenses (collectively 710). Although in the embodiment shown the anamorphic illumination optics 710 are depicted or represented as including a single prism and lens, it will be appreciated that the anamorphic illumination optics can include any number of prisms, lenses and to refract and transmit light from the light source 702 to the linear array 706 to fully illuminate substantially a single pixel in the linear array. Modulated light from the linear array 706 is then transmitted through imaging optics 712 to the imaging plane 714 to illuminate a swath or strip extending substantially across the entire width of the imaging plane. Each laser bar 704 is collimated by FAC (Fast Axis Collimator) lens 708 having an NA of nearly zero. By using the FAC lens 708 and anamorphic illumination optics 710, each laser bar 704 can illuminate a single pixel on the linear array 706. Preferably, an incident angle of light on the linear array 706 is less than a half of a diffraction angle of the $1^{st}$ order beam from the linear array. As in FIG. 6A, the dashed lines from the linear array 706 to the NA 718 illustrate $1^{st}$ order beams while the solid, bold lines show the main, $0^{th}$ order beams.

Modulated light from the linear array 706 is then transmitted through imaging optics 712 to the imaging plane 714. In some embodiments, such as that shown in FIG. 7, the imaging optics 712 can also include anamorphic optics, represented here by anamorphic lens 720 and cylindrical 722. This embodiment is particularly advantageous where the pixel size of linear array 706 is not square. By using or adding anamorphic imaging optics to the imaging optics 712 a reduced image of the linear array is projected on the imaging plane along the vertical direction, thereby correcting or compensating for any distortion or non-square pixels in the of linear array 706.

Thus, embodiments of AM, SLS and CTP systems including SLM with an array of 2D, MEMS-based modulators, and an illumination source including anamorphic optics for improving contrast have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A system comprising:
a spatial light modulator (SLM) including a plurality of two dimensional (2D) modulators arranged to form an array having a plurality of pixels along a longitudinal axis of the array, each pixel comprising multiple 2D modulators along a transverse axis of the array electrically coupled to receive a common drive signal and to modulate light reflected therefrom in response to the drive signal;
an illumination source including a laser and anamorphic illumination optics for focusing light from the laser onto the array; and
imaging optics for focusing modulated light from the array onto an image plane,
wherein the anamorphic illumination optics are configured to provide a transverse numerical aperture (NA) along the transverse axis of the array that is smaller than a diffraction angle of the modulated light reflected from the array along a transverse axis of the array, and a longitudinal NA along the longitudinal axis of the array that is greater than the transverse NA.

2. The system of claim 1 wherein the longitudinal NA is equal to or greater than a diffraction angle of the modulated light reflected from the array along a longitudinal axis of the image plane.

3. The system of claim 1 wherein in each pixel the number of multiple 2D modulators along the transverse axis of the array is greater than a number of 2D modulators along the longitudinal axis.

4. The system of claim 3 wherein in each pixel the number of 2D modulators along the longitudinal axis is two or fewer.

5. The system of claim 1 wherein the laser comprises a plurality of high power diode lasers arranged as a laser bar to illuminate a single pixel in the array.

6. The system of claim 1 wherein each of the plurality 2D modulators comprise a portion of a static face plate and a movable actuator, the static face plate and each of the movable actuators include a reflective surface formed thereon.

7. The system of claim 1 wherein the imaging optics comprise anamorphic imaging optics configured to provide a transverse numerical aperture (NA) along the transverse axis of the array that is smaller than a diffraction angle of the modulated light reflected from the array along a transverse axis of the array, and a longitudinal NA along the longitudinal axis of the array that is greater than the transverse NA.

8. A computer-to-plate (CTP) system comprising:
a spatial light modulator (SLM) including a plurality of two dimensional (2D) modulators arranged to form an array having a plurality of pixels along a longitudinal axis of the array, each pixel comprising a number of 2D modulators along a transverse axis of the array and a number of 2D modulators along the longitudinal axis electrically coupled to receive a common drive signal and to modulate light reflected therefrom in response to the drive signal, wherein the number of 2D modulators along the transverse axis of the array is greater than the number of 2D modulators along the longitudinal axis;
an illumination source including a laser and anamorphic illumination optics for focusing light from the laser onto the array; and
imaging optics for focusing modulated light from the array onto an image plane,
wherein the anamorphic illumination optics are configured to provide a transverse numerical aperture (NA) along the transverse axis of the array that is smaller than a diffraction angle of the modulated light reflected from the array along a transverse axis of the image plane, and a longitudinal NA along the longitudinal axis of the array that is greater than the transverse NA, and equal to or greater than a diffraction angle of the modulated light reflected from the array along a longitudinal axis of the image plane.

9. The CTP system of claim 8 wherein in each pixel the number of 2D modulators along the longitudinal axis is two or fewer.

10. The CTP system of claim 9 wherein in each pixel the number of 2D modulators along the transverse axis is equal to or greater than forty.

11. The CTP system of claim 8 wherein the laser comprises a plurality of high power diode lasers arranged as a laser bar to illuminate a single pixel in the array.

12. The CTP system of claim 8 wherein each of the plurality 2D modulators comprises a (MEMS) based, electrostatically deflectable diffractive modulator.

13. The CTP system of claim 12 wherein each of the plurality 2D modulators comprise a portion of a static face plate and a movable actuator, the static face plate and each of the movable actuators include a reflective surface formed thereon.

14. The CTP system of claim 8 wherein the imaging optics comprise anamorphic imaging optics configured to provide a transverse numerical aperture (NA) along the transverse axis of the array that is smaller than a diffraction angle of the modulated light reflected from the array along a transverse axis of the array, and a longitudinal NA along the longitudinal axis of the array that is greater than the transverse NA.

15. An additive manufacturing (AM) system comprising:
a spatial light modulator (SLM) including a plurality of two dimensional (2D) modulators arranged to form an array having a plurality of pixels along a longitudinal axis of the array, each pixel comprising a number of 2D modulators along a transverse axis of the array and a number of 2D modulators along the longitudinal axis electrically coupled to receive a common drive signal and to modulate light reflected therefrom in response to the drive signal, wherein the number of 2D modulators along the transverse axis of the array is greater than the number of 2D modulators along the longitudinal axis;
an illumination source including a laser and anamorphic illumination optics for focusing light from the laser onto the array; and
imaging optics for focusing modulated light from the array onto an image plane,
wherein the anamorphic illumination optics are configured to provide a transverse numerical aperture (NA) along the transverse axis of the array that is smaller than a diffraction angle of the modulated light reflected from the array along a transverse axis of the image plane, and a longitudinal NA along the longitudinal axis of the array that is greater than the transverse NA, and equal to or greater than a diffraction angle of the modulated light reflected from the array along a longitudinal axis of the image plane.

16. The AM system of claim 15 wherein in each pixel the number of 2D modulators along the longitudinal axis is two or fewer.

17. The AM system of claim 16 wherein in each pixel the number of 2D modulators along the transverse axis is equal to or greater than forty.

18. The AM system of claim 15 wherein the laser comprises a plurality of high power diode lasers arranged as a laser bar to illuminate a single pixel in the array.

19. The AM system of claim 15 wherein each of the plurality 2D modulators comprises a (MEMS) based, electrostatically deflectable diffractive modulator.

20. The AM system of claim 19 wherein each of the plurality 2D modulators comprises a portion of a static face plate and a movable actuator, the static face plate and each of the movable actuators include a reflective surface formed thereon.

21. The AM system of claim 15 wherein the imaging optics comprise anamorphic imaging optics configured to provide a transverse numerical aperture (NA) along the transverse axis of the array that is smaller than a diffraction angle of the modulated light reflected from the array along a transverse axis of the array, and a longitudinal NA along the longitudinal axis of the array that is greater than the transverse NA.

\* \* \* \* \*